United States Patent [19]
Havens et al.

[11] 4,056,682
[45] Nov. 1, 1977

[54] GASKET APPARATUS

[75] Inventors: Charlie C. Havens, Garland; James A. Rutelonis, Plano, both of Tex.

[73] Assignee: Rockwell International Corporation, El Segundo, Calif.

[21] Appl. No.: 658,954

[22] Filed: Feb. 18, 1976

[51] Int. Cl.² .............................................. H05K 9/00
[52] U.S. Cl. .............................. 174/35 GC; 277/236; 285/368
[58] Field of Search .......... 174/35 GC, 35 MS, 35 R; 219/10.55 D; 277/236; 333/98; 285/363, 365, 366, 367, 368

[56] References Cited

U.S. PATENT DOCUMENTS

| | | | |
|---|---|---|---|
| 1,721,326 | 7/1929 | Wilson | 277/236 X |
| 1,765,443 | 6/1930 | Peterson | 174/35 GC |
| 2,674,644 | 4/1954 | Goodloe | 174/35 GC |
| 2,796,457 | 6/1957 | Stinger | 174/36 GC |
| 3,317,224 | 5/1967 | Kuskevics et al. | 277/236 X |
| 3,504,095 | 3/1970 | Roberson et al. | 174/35 GC |
| 3,602,532 | 8/1971 | Ehrenberg | 285/364 |
| 3,637,223 | 1/1972 | Weber | 277/236 X |
| 3,874,675 | 4/1975 | Belter et al. | 277/236 X |
| 3,885,084 | 5/1975 | Kaiserwerth et al. | 174/35 GC |

FOREIGN PATENT DOCUMENTS

| | | | |
|---|---|---|---|
| 854,491 | 4/1940 | France | 285/363 |
| 531,578 | 12/1956 | Germany | 174/35 GC |

Primary Examiner—Arthur T. Grimley
Attorney, Agent, or Firm—Bruce C. Lutz; H. Fredrick Hamann

[57] ABSTRACT

Gasket material which is curved in cross-sectional shape. The curved section is placed between mating flanges situated around an opening such as an RF conduit. The radius of curvature is such that the modulus of elasticity is not exceeded upon compression of the flanges and thus the gasket is reusable while providing maximum contact pressure on the mating surfaces for sealing purposes. The curved contact area is offset from any openings in the flange for the passage of fastening means that provide the compressive action. This offset of the maximum pressure contact areas from openings increases the sealing capability of the gasket.

1 Claim, 7 Drawing Figures

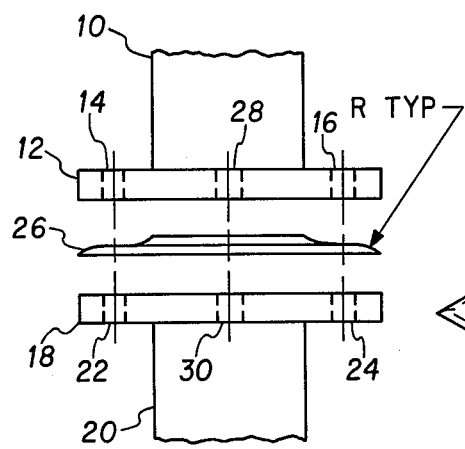
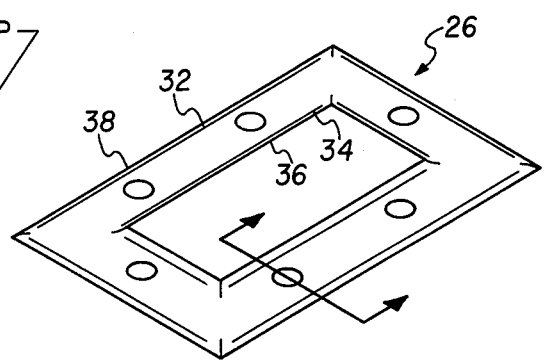
FIG. 1     FIG. 2
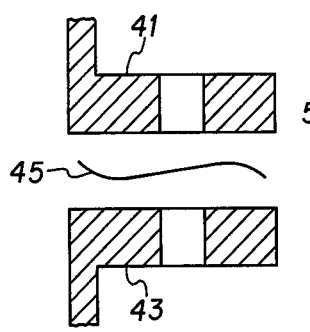 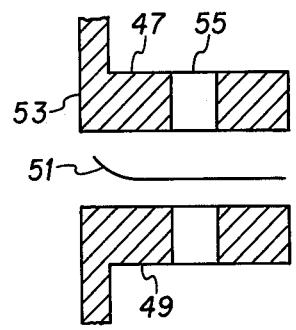 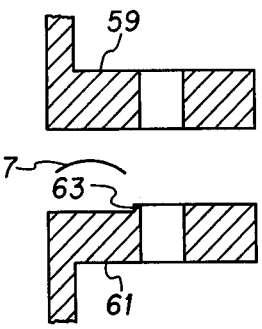
FIG. 3a     FIG. 3b     FIG. 3c
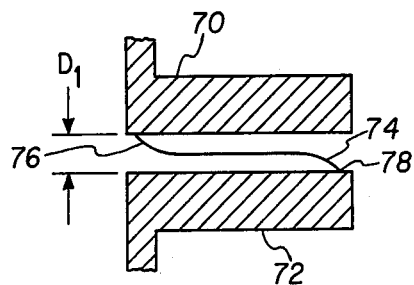 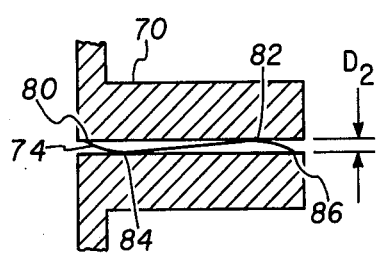
FIG. 4a     FIG. 4b

GASKET APPARATUS

THE INVENTION

The present invention is generally related to gasket material and more specifically related to a gasket having curved contact areas which curves are of such a radius that the modulus of the elasticity of the material is not exceeded upon compression thereby providing a reusable gasket.

Prior art gasket material has generally been of a flat design with the gasket material being compressible and somewhat inelastic. In other words, while it could be compressed, it did not return to its previous height. Thus, prior art gaskets have normally not been reusable. One application of the present invention is as a radio frequency (RF) gasket. In theory, the small opening provided for the use of a fastening means to hold flanges together on RF conduits are minimal and will not pass or leak radio frequency signals. It has been determined, however, that if the contact areas of the gasket material are provided between the interior of the conduit and the openings for the fastening means continuously around the perimeter of the conduit interior, that RF leakage is measurably reduced. Thus, the present invention has two novel features wherein the first lies in the realization that some of the maximum pressure contact areas of a gasket should lie between the opening for RF signals and the openings for fastening means. The second inventive concept, as claimed in a copending application Ser. No. 659,173 filed herewith, lies in the design of the curved portions wherein the modulus of elasticity of the material is not exceeded upon compression of the flanged portions to join the conduits.

It is, therefore, an object of the invention to provide an improved gasket design.

Other objects and advantages of the present invention may be ascertained from a reading of the specification and appended claims in conjunction with the drawings wherein:

FIG. 1 is a breakaway view of two RF conduits including flanges and an intermediate gasket;

FIG. 2 is an isometric drawing of one version of a gasket designed in accordance with the teachings of this invention;

FIGS. 3A, 3B and 3C illustrate cross-sectional views of alternate embodiments of gasket design;

FIG. 4A illustrates a gasket of FIG. 1 in cross-sectional view in greater detail for explanation; and FIG. 4B illustrates the gasket of FIG. 4A in compressed and operative form.

DETAILED DESCRIPTION AND OPERATION

Referring first to FIG. 1, it will be noted that a conduit 10 has a flange 12 containing openings 14 and 16 through which fastening means (not shown) may be used to attach this flange to a flange 18 of a further conduit 20. The flanges 18 of conduit 20 has openings 22 and 24 for the fastening means corresponding to openings 14 and 16. A gasket 26 is illustrated positioned between flanges 12 and 18 and although not specifically illustrated contains openings for the passage of fastening means. Further fastening means 28 and 30 are illustrated in flanges 12 and 18, respectively, as the fastening means at the end of the flange.

In FIG. 2, an isometric view is illustrated of the flange 26 of FIG. 1 with the openings illustrated for the fastening means. The gasket of FIGS. 1 and 2 shows two curved portions, a first of which is designated as 32 and a second of which is designated as 34. Each of these curved portions is continuous and extends the entire distance around the gasket. As illustrated, the curved portion 34 provides primary leakage sealing capability, while the curved portion 32 provides secondary sealing. In addition, the gasket contains an inner edge 36 and an outer edge 38. These edges also provide a high pressure contact area which provides sealing capability on the opposite flange from the adjacent end associated curved portion such as 34 and 32, respectively.

In FIG. 3A, an alternate version of a double-curved gasket is illustrated wherein it is initially shaped so that there will be less total distortion forces acting on the gasket material than would be true of the design illustrated in FIGS. 1, 2 and 4. For purposes of discussion, in FIG. 3A, the upper flange will be provided a designator 41, the lower flange 43, and the gasket 45.

In FIG. 3B, an upper flange 47 and a lower flange 49 surround a single curve gasket 51. As will be noted, the curved portion lies intermediate the inner conduit area 53 of one of the flanges and a fastener opening 55.

In FIG. 3C, a further single curve gasket 57 is illustrated positioned between an upper flange 59 and a lower flange 61. The lower flange 61 has a cutout portion with a shoulder 63. The shoulder 63 is used to position the gasket 57 so that upon compression the gasket will not slip and extend into the opening of the conduit at any interior conduit position.

In FIG. 4A, an upper flange 70 and a lower flange 72 enclose a gasket 74 shaped much in the manner of that of FIG. 2. The flanges 70 and 72 are just commencing to compress the gasket 74 which in one embodiment comprised beryllium copper having a thickness of 0.006 inches and wherein the distance $D_1$ was .076 inches. Thus, the distance from the center of the material 74 to each of the edges such as 76 and 78 was 0.038 inches.

In FIG. 4B, the flanges 70 and 72 are compressed to a distance $D_2$ of approximately 0.020 inches. As illustrated, the gasket 74 provides contact to the flange 70 at points 80 and 82. It contacts flange 72 at points 84 and 86. In one embodiment of the invention, the distance between points 80 and 86 was 0.4 inches while the distance between contact points 82 and 84 was 0.2 inches. With this design, it may be ascertained that the pressure between the flanges and the curved portions of the gasket 74 are approximately twice that occurring between the flanges and the edges such as 80 and 86. The radius of curvature for the gasket material was designated at 0.25 inches. A formula expressed as $R = CE/S$ was used to determine the radius of curvature. In this formula, R is the radius of curvature in inches, C is the distance from the centroid to the outermost fiber of the material or in other words is one-half the thickness of the material, E is the modulus of elasticity of the material and S is the maximum fiber stress of yield stress of the material. For the beryllium copper mentioned above, this formula provides a radius of curvature of 0.35 inches. However, this assumes maximum compression to a perfectly flat shape and still allows return of the material to the original shape since the modulus of elasticity is not exceeded. However, it will be noted that normally the flanges cannot be fastened together tight enough to completely flatten the gasket material due to irregularity in the mating surfaces. Even if there is no mating surface irregularity and the elastic limit of the gasket material is exceeded, there will be a partial return of the gasket toward its original shape thus still providing reusability. The radius of curvature in the gasket, as defined above, would still be equal to or less than 0.35 inches after the partial return even if deformed to a completely flat shape. Since this maximum compression was defined to be in the neighborhood of a gap illustrated as $D_2$, a tighter radius of curvature can be used thereby providing higher pressures at points 82 and 84 and still permitting the material to return to or near its original non-deformed condition.

Although not illustrated in FIGS. 4A and 4B, the openings such as shown in FIG. 1 would be intermediate the contact points 82 and 84. While the contact point 80 is illustrated as inset from the inner surface of flange 70, in actual practice this contact point would be as near as practical to the inner surface of the conduit to prevent distortion of the signal or interference with the signal passing through the conduit.

While thus far the description in this specification has concerned itself with RF gasket material, this concept may be used to satisfactorily seal openings or passageways from adverse conditions or contaminants with the gasket material being reusable. Thus, while we have illustrated and specifically described a gasket for use with RF, we wish to include any other suitable uses such as for sealing any types of fluid or other products from escaping from an enclosed area to other areas and wish to be limited only by the scope of the appended claims.

What is claimed is:

1. RF sealing apparatus for sealing a connection upon compression between a first RF conduit flange and a second RF conduit flange comprising:
   a thin flexible electrically conducting substantially planar structure having a central opening therein alignable with a hole in said conduit and having a plurality of fastener passageways;
   an inside edge, defining said opening, angularly disposed from said planar structure to provide high pressure contact with said first flange;
   an inside curved contact area adjacent said inside edge to engage said second flange, for providing, under deformation, a high pressure contact therewith, the inside curved contact completely circumscribing said opening between said inside edge and said plurality of fastener passageways;
   an outside edge circumscribing said plurality of fastener passageways angularly disposed from said planar structure to produce high pressure contact with second flange; and
   an outside curved contact area adjacent said outside edge to engage said first flange, to provide, under deformation, a high pressure contact therewith.

* * * * *

UNITED STATES PATENT AND TRADEMARK OFFICE
CERTIFICATE OF CORRECTION

PATENT NO. : 4,056,682
DATED : November 1, 1977
INVENTOR(S) : Charlie C. Havens and James A. Rutelonis It is certified that error appears in the above-identified patent and that said Letters Patent are hereby corrected as shown below:

IN THE CLAIMS

Claim 1, column 4, line 23, after "with" insert --said--.

Signed and Sealed this

Second Day of May 1978

[SEAL]

Attest:

RUTH C. MASON
Attesting Officer

LUTRELLE F. PARKER
Acting Commissioner of Patents and Trademarks